United States Patent [19]

Springer, Jr. et al.

[11] Patent Number: 4,532,217

[45] Date of Patent: Jul. 30, 1985

[54] BIOLOGICAL USES OF SHIFT REAGENTS FOR THE NUCLEAR MAGNETIC RESONANCE OF PHYSIOLOGICAL METAL CATIONS

[75] Inventors: Charles S. Springer, Jr., E. Setauket, N.Y.; Martin M. Pike, Boston, Mass.; James A. Balschi, Centereach, N.Y.; David M. Yarmush, Brooklyn, N.Y.; Simon C. K. Chu, Centereach, N.Y.

[73] Assignee: The Research Foundation of State University of New York, Albany, N.Y.

[21] Appl. No.: 599,596

[22] Filed: Apr. 13, 1984

Related U.S. Application Data

[62] Division of Ser. No. 408,253, Aug. 16, 1982, abandoned.

[51] Int. Cl.³ .............................................. G01N 24/08
[52] U.S. Cl. ..................................... 436/79; 436/173; 324/307
[58] Field of Search ............... 436/79, 173; 260/429.2; 252/408.1; 324/307-309

[56] References Cited

U.S. PATENT DOCUMENTS 3,950,135 4/1976 Whitesides et al. ................. 436/173
4,206,132 6/1980 Sievers ............................. 436/173 X
4,257,955 3/1981 Ganson et al. .................. 260/330.8

OTHER PUBLICATIONS

Chemical Abstracts, CA: 83(22)184375u, Makoto et al.
Moeller et al, "Coordination Chemistry of Rare Earth Metal Ions", *Progress in the Science and Technology of the Rare Earths*, vol. 3, pp. 73-117, New York, 1968.

*Primary Examiner*—Howard S. Williams
*Attorney, Agent, or Firm*—Omri M. Behr

[57] ABSTRACT

A novel group of nuclear magnetic resonance shift reagents is disclosed. This group comprises the anionic chelates of dysprosium and thulium wherein the chelate moiety has a charge of at least −3. These reagents cause a shift in the nuclear magnetic resonance spectrum of aqueous solutions of alkali and alkaline earth metal ions. By providing shift reagents to one side of a membrane capable of permitting the transport of alkali or alkaline earth metal ions therethrough and having such ions on one or the other side of said membrane and providing an environment in which said ions can pass through said membrane, by measuring the NMR spectrum of the total environment, the area of the peak of the absorpiton due to a predetermined ionic species caused by the shifted ions is compared to that due to the unshifted ions, the rate of transport through the membrane may be determined.

3 Claims, 4 Drawing Figures

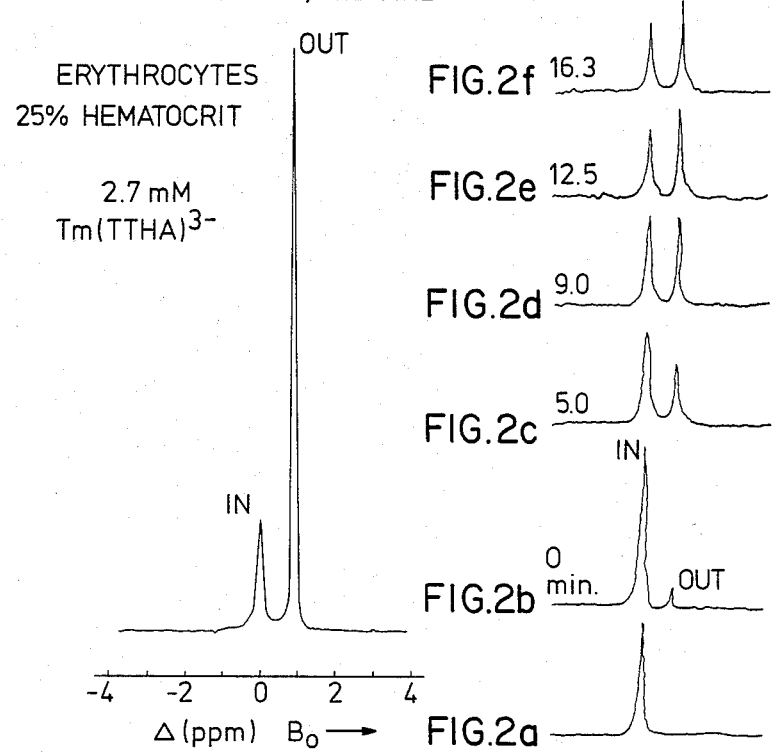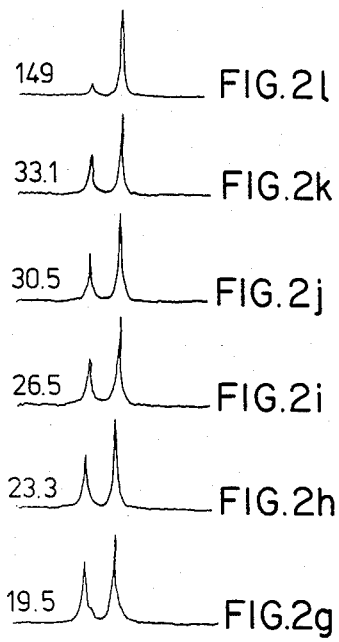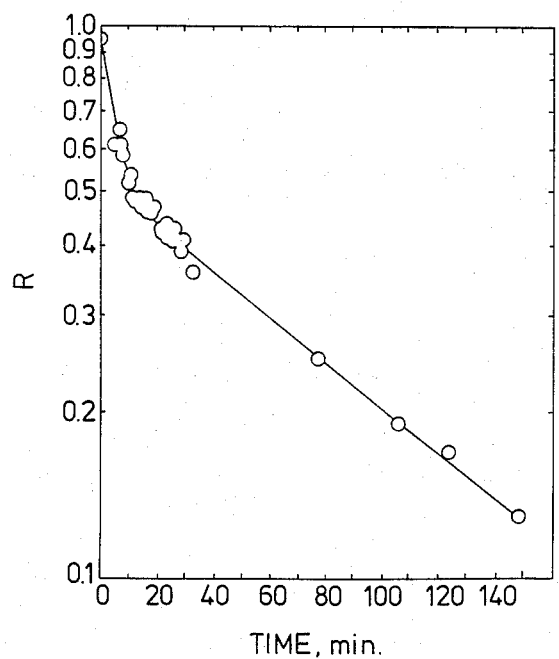

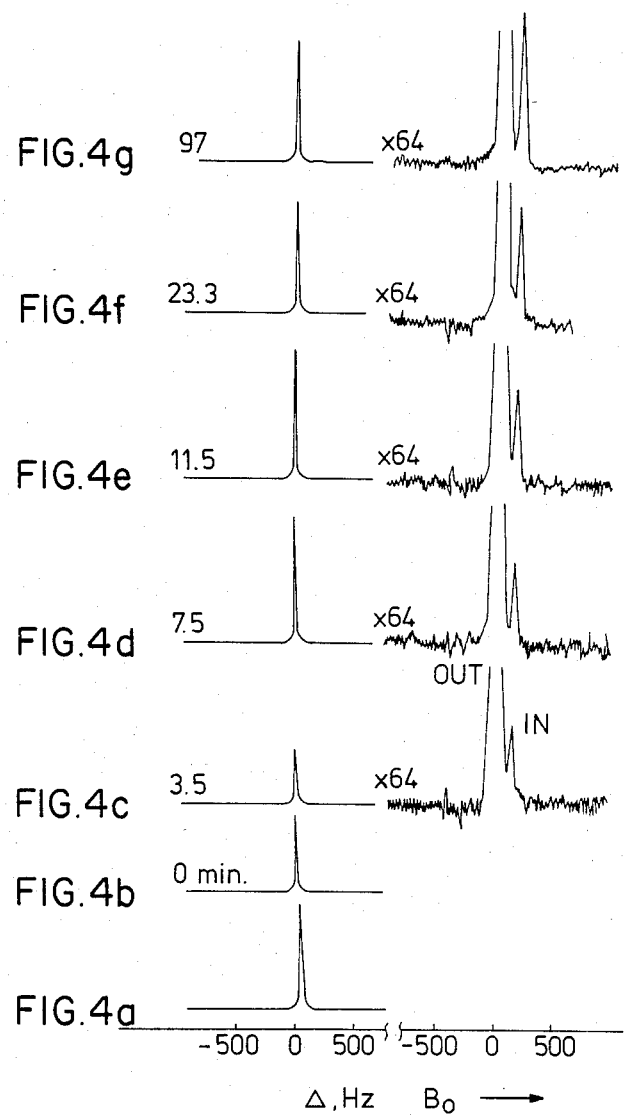

duces a substantially higher amount of base which, particularly in the form of metal ions may complicate the nuclear magnetic resonance readings.

As chelating agents there may be employed any suitable anionic acidic chelating agents. For example, there may be employed dipicolinic acid ($H_2DPA$), nitrilotriacetic acid ($H_3NTA$), phytic acid, chelidamic acid ($H_3CA$), triethylenetetraminehexacetic acid ($H_6TTHA$), citric acid, tungstic Acid ($H_2WO_4$), 11-phosphotungstic acid ($H_7PW_{11}O_{39}$), silicotungstic acid ($H_4SiW_{12}O_{40}$), 9-phosphotungstic acid ($H_3PW_9O_{31}$), ethylene diamine tetra(methylene phosphonic acid) ($H_8EDTMP$), nitrilo tris(methylene phosphonic acid) ($H_6NTMP$), 1-hydroxyethane-1,1-diphosphonic acid ($H_4$1-HEDP).

As bases there may be employed water soluble organic or inorganic proton accepting bases. As organic bases there may be employed tertiary amines suitably tri(hydroxyalkyl)amines such as tri(hydroxyethyl)amine. As inorganic bases there may be employed such bases as lithium hydroxide. The foregoing listing of bases is purely illustrative and should in no way be considered to be limiting.

Many variations of carrying out the transport measurements of the present invention will be clear to those skilled in the art, however, for purposes of illustration one general method will be discussed.

As biological memebranes there may be employed any suitable biological cell. The cells may be purified to remove external materials. The cells are then placed in a suitable aqueous medium, the nature of the medium depending upon the experiment to be carried out. For example, if it is desired to measure the transport of, say, sodium ions within the cell through the cell wall into the surrounding medium, then the cells maybe placed into an aqueous medium of lower sodium molarity than the sodium ions inside the cells (if this is known) and the medium outside the cells provided with a suitable amount of the anionic chelating agent.

This mixture is measured in an NMR spectrometer and will show a sharp differentiation due to the shift with respect to the concentration of sodium ions outside the cells with respect to the sodium ions within the cells.

An agent causing the sodium ions to move towards it is then added to the surrounding medium and the change in peak heights of the shifted and unshifted sodium ions is then observed. The area under the peaks indicates the relative concentrations of sodium ion.

It will be understood by those skilled in the art that if the movement of ions other than sodium is required to be measured different segments of the NMR spectrum would be observed and furthermore appropriate adjustments would be made to the aqueous environment outside the cells. Similarly, if it is desired to contact experiments relating to the rate of transport of certain ions from outside the cell wall into the cell the cells could be treated previously by diffusion thereinto of the attracting material and if desired the shift reagent, although this could remain outside the cells and thereafter the experiment carried out in the heretofore described manner. It will be clear to those skilled in the art that the method may be varied as desired with respect to the direction of transport and the ion measured.

DESCRIPTION OF THE DRAWINGS

FIG. 1 shows the NMR spectrum (95.2 MHz) of a dispersion of etythrocytes (25% hematrocrit) in 16 mM $Na^+$ in the presence of 2.7 mM(triethylenetetramine hexacetothulium III).

FIG. 2 shows $^{23}Na$ NMR spectra (132.3 MHz, 11.74T) of a dispersion of LUV in $^2H_2O$ (a). In the NMR tube, the final concentrations were: egg lecithin, 6.0 mM; $NaCl_{in}$) 60 mM; $NaCl_{out}$), 0.27 mM; and $LiCl_{out}$), 35 mM (b) Concentrations were as in (a) except that the outside aqueous space was made 6.3 mM in $[HN(CH_2CH_2OH)_3]_3Dy[N(CH_2CO_2)_3]_2$. For a and b, 512 free-induction decays (FID) were accumulated in 208 sec. (c–l) Spectra are labeled made 0.16 μM in gramicidin. The times recorded are those of the midpoints of the data accumulation periods, which were 156 FID in 64 sec (c), 128 FID in 52 sec (d–j), and 512 FID in 208 sec (k and l). The temperature was ca. 297 K.

FIG. 3 shows the time dependence of the relative intensities of the two peaks of FIG. 2. The data are plotted as log R [=(fractional area inside)/(fractional area inside at time zero; spectrum in FIG. 2b)] versus time. The solid curve is the result of computer fitting.

FIG. 4 shows $^{23}Na$ NMR spectra (132.3 MHz, 11.74T) of a dispersion of LUV in $H_2O$ (a) The final concentrations in the NMR tube were: egg lecithin, 7.5 mM; $LiCl_{in}$, 40 mM; $LiCl_{out}$, 29 mM; $NaCl_{out}$, 43 mM; $[HN(CH_2CH_2OH)_3]_3Dy[N(CH_2CO_2)_3]_{2in}$, 5.0 mM; and $[HN(CH_2CH_2OH_3]_3Dy[N(CH_2CO_2)_3]_{2out}$, 3.7 mM (b) Concentrations were as in (a) except that the outside aqueous space has been made 5.3 mM in $LuCl_3$ (c–g) Spectra are labeled with the times elapsed after the solution was made 0.16 μM in gramicidin. The times recorded are those of the mid-points of the data accumulation periods, which were 128 FID in 52 sec (c–e) and 256 FID in 105 sec (f and g). On the righthand side of each of the spectra in c–g, a plot is recorded where the vertical scale has been expanded. The temperature was ca 297° K.

EXAMPLE 1

A suspension (25% hematocrit) of erythrocytes of out dated blood is prepared in choline chloride (150 mM) buffer. The extracellular solution is made 16 mM in $Na^+$ and 2.7 mM in the ionic complex Tm $(TTHA)^{3-}$. The spectrum shown in FIG. 1 is obtained by nuclear magnetic resonance spectroscopy and shows the cytoplasmic sodium concentration of 34 mM $Na^+$ as compared to 37 mM $Na^+$ as obtained by atomic absorption spectroscopy.

EXAMPLE 2

Large unilamellar vesicles (LUV) of egg lecithin (Sigma) were prepared essentially by the dialytic detergent-removal technique of Reynolds and coworkers (*Biochemistry* 20, 833 (1981)) which produces a reasonably monodisperse population of vesicles averaging 240 nm in diamine ter. In a typical preparation, 2 ml containing 10 mM egg lecithin, 150 mM octyl β-D-glycopyranoside (Calbiochem-Behring), and 60 mM NaCl was dialyzed (Spectrapor No. 3 tubing) two or three times (an average of ca. 13 hr each) against a large quantity (an average of ca 3 liters) of 60 mM NaCl. This removed the detergent and produced the LUV. The NaCl containing LUV were further dialyzed against 2 liters of 60 mM LiCl for 13 hrs. to remove external Na. Passive transport was induced by injecting a small amount (microliters) of a concentrated methanol solution of gramicidin D (Calbiochem-Behring), a mixture

BIOLOGICAL USES OF SHIFT REAGENTS FOR THE NUCLEAR MAGNETIC RESONANCE OF PHYSIOLOGICAL METAL CATIONS

This invention was made with Government support under NSFPM7807918(431-1102B) and NSFGPCM8104630(431-1102C) awarded by The National Science Foundation. The Government has certain rights in this invention.

This application is a divisional of application Ser. No. 408,253, filed Aug. 16, 1982, now abandoned.

BACKGROUND OF THE INVENTION

The presence of and transport through cell walls of metallic ions has long been recognized as having considerable physiological importance. Various methods have been developed for carrying out such measurements. The principal methods used heretofore have been the use of radioactive isotopic tracers and the use of ion selective electrodes. The use of radioactive tracers carries with it the problem of radioactive waste and the necessity of a certain amount of destructive testing of sacrificial aliquots as well as extensive subsequent analytical workup for each point in a transport study.

While ion-selective electrodes are of considerable significance they can not be utilized to study small cells or organelles because of size limitations.

Until recently, nuclear magnetic resonance technology could not be utilized in such studies since the time response of the available machines was not sufficiently rapid. New machines have made possible response time of the order of tens of milliseconds and therefore the use of NMR techniques for kinetic studies of ionic transport in cells has become feasable. The use of NMR technology requires the provision of reagents to differentiate between ions on two sides of the cell wall. Such reagents cause a shift in the NMR spectrum and are known as shift reagents. Heretofore, sufficiently powerful shift reagents for the shifting of the spectrum of alkali and alkaline earth metal ions in an aqueous environment have not been available.

SUMMARY OF THE INVENTION

Novel dysprosium and thulium chelates are provided. These chelates are anionic chelates having a charge of at least −3. The novel compounds are readily prepared by reacting the appropriate oxide or chloride with the predetermined chelating agent in acid form in the presence of an appropriate basic water soluble proton acceptor. In view of the uses put to these novel compounds in the present invention it is not necessary to isolate the complex thus formed. The complex may indeed be formed in solution in situ.

The novel anionic chelates of the present invention cause a shift, usually an upshift, in the nuclear magnetic resonsance spectrum of alkali and alkaline earth metal ions. The amount of this shift is relative to the concentration relationship between the concentration of the chelate and the concentration of the ion to be shifted. The greater the relative amount of chelate the greater the amount of shift. While there is no specific lower ratio it has been found that ratios of chelate to ion of less than 0.05 to 1 (in terms of molar concentration), do not give rise to adequately useful results.

The novel reagents enable measurements to be carried out of the movement of alkali or alkaline earth metal ions through biological and other membranes through which they are capable of passing. In the operation of such a measurement, the shift reagent is placed on one side of the membrane and the ion to be measured is placed, depending on the circumstance, either on that side of the membrane or the other side. An environment is then provided to enable the ions whose spectrum is to be shifted to move either towards the shift reagent or away from it.

The entire system is placed in an environment in which NMR measurements of the entire environment may be carried out. As the concentration of ions on the side of the membrane free of shift reagent changes the NMR spectrum registered by the machine will vary. By measuring the relative area under the peaks thus obtained the rate of transport of the ions may be measured.

While the present invention is in no way limited thereto the technique made possible by this invention is extremely useful in determining the transport of alkali and alkaline earth metal ions in particular $^{23}Na^+$, $^{39}K^+$, $^7Li^+$, $^{43}Ca^{2+}$ and $^{25}Mg^{2+}$ across cell walls. The technique permits the shift reagent, if desired, to be dialyzed into the cell itself, or placed outside the cell, and the cell placed in an environment wherein the ions in question will either diffuse into or out of the cells under study. Since the ions which are in the presence of the shift reagent will show a peak in a different location compared to the ions which are out of the presence of the shift reagents, NMR measurements taken of the entire system will readily indicate the movement of ions which takes place because these are a function of the shifted and unshifted peak areas.

DESCRIPTION OF THE PREFERRED EMBODIMENTS

The anionic chelates of dysprosium or thulium of the present invention may be prepared by one of two methods which can be summarized as follows:

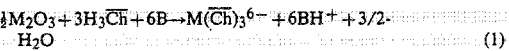

(1)

wherein M is dysprosium or thulium, $H_3\overline{Ch}$ is a chelating agent in acid form (in this case the $\overline{Ch}$ moiety being trivalent) and B is a water soluble organic or inorganic proton accepting base. M is always trivalent. The stoichiometry of the reaction will depend on the number of ligands in a chelate moiety. The reaction quantities are stoichiometric, however, up to 10% excess of the chelating agent in acid form is helpful. The action is carried out in an aqueous medium. The oxide and the acid are suspended in the aqueous medium and the base added slowly thereto. The only important condition in the reaction is that the rate of addition of the base be controlled so that at no time during addition does the pH exceed pH 7. When all the base has been added, stirring is continued until the mixture becomes clear. The reaction time may be up to 5 days and the temperatures may, if necessary, be raised from ambient up to 50° C.

In an alternate embodiment in place of the oxide the chloride may be used as summarized in the following reaction sequence:

(2)

While the chloride method of reaction (2) is simpler since it is homogenous, it is generally not preferred because it leads to possible complications in the second (measurement) stage of the invention, in that it introof gramicidins. Conditions for the NMR spectra are given in the text and figure legends.

EXAMPLE 3

In a further example dialysis was against 40 MM LiCl/5 mM [HN(CH$_2$CH$_2$OH)$_3$]$_3$Dy[N(CH$_2$CO$_2$)$_3$]$_2$ (triethanol-ammonium dysprosium nitrilotriacetate in place of 60 MM NaCl. External NaCl was added to the LiCl-containing LUV but other conditions were as in Example 2.

EXAMPLE 4

FIG. 2 depicts the $^{23}$Na NMR spectrum (132.3 MH2, Bruker WM-500) of a dispersion of LUV prepared as above in Example 2 from egg lecithin, containing 60 mM NaCl inside the vesicles. In the aqueous space outside the vesicles was provided 35 mM in LiCl and <0.5 mM in NaCl. FIG. 2a shows the spectrum when no shift reagent was added. The single sharp resonance represents the Na$^+$ both inside and outside the vesicles, referred to as Na$^+_{in}$ and Na$^+_{out}$. FIG. 2b shows the spectrum after the outside aqueous space was made 6.3 mM in [HN(CH$_2$CH$_2$OH)$_3$]$_3$Dy[N(CH$_2$CO$_2$)$_3$]$_2$. The single resonance in FIG. 2a is split into two peaks in FIG. 2b; the smaller one is shifted upfield by 190.4 Hz, and the larger one, downfield by 9.8 Hz. Because we found Dy[N(CH$_2$CO$_2$)$_3$]$_2^{3-}$ to induce upfield isotropic hyperfine shifts ($\Delta$) in the $^{23}$Na$^+$ resonance, the assignment of the upfield peak to Na$^+_{out}$ is clear.

The fraction of the total peak area due to the inside resonance was measured (by planimetric integration) to be 0.92 in the FIG. 1b spectrum. (The spectra were obtained with NMR conditions such that there should be no differential T$_1$ effects). The value for the fraction of the total aqueous volume tained P of $5.6 \times 10^{-9}$ cm/sec and $2.9 \times 10^{-10}$ cm/sec.

EXAMPLE 5

Transport of Na$^+$ into LUV is shown in FIG. 4. The spectrum in FIG. 4a is that of a sample of LUV prepared in accordance with Example 4 in that [HN(CH$_2$CH$_2$OH)$_3$]$_3$Dy[N(CH$_2$CO$_2$)$_3$]$_2$ was present both inside (5.0 mM) and outside (3.7 mM) the vesicles, as was LiCl (40 mM inside, 29 mM outside). The single sharp $^{23}$Na$^+$ resonance is due to NaCl added after vesicle formation and thus, present only outside (43 mM). The spectrum in FIG. 4b was obtained after the outside aqueous solution of FIG. 4a was made 5.3 mM in Lu$^{3+}$ (as the chloride). Because Lu$^{3+}$ acts as an antishift reagent by inactivating Dy[N(CH$_2$CO$_2$)$_3$]$_2^{3-}$, the Na$^+$ resonance is shifted back downfield by 58.6 Hz in FIG. 4b. However, the Dy[N(CH$_2$CO$_2$)$_3$]$_2^{3-}$ inside the vesicles (ca 20 × 10$^3$ per vesicle) remained intact and able to shift the resonance frequency of any Na$^+$ transported in. This is seen in FIG. 4 c-g where the time-dependence of the spectrum, measured in minutes from the introduction of gramicidin (0.16 µM; ca 11 gramicidin molecules per vesicle) is depicted. A small, sharp peak is seen to grow ca. 187 Hz upfield of the large resonance representing the Na$^+$ remaining outside. This also demonstrates that gramicidin does not transport Dy$^{3+}$ across the vesicle membrane on the time scale of this experiment.

EXAMPLE 6

Dysprosium oxide (2.83 g) is taken up in water (50 ml) in the presence of nitrilotriacetic acid (H$_3$NTA) (6.08 g) and tri(hydroxyethyl) amine (6.78 g) is added slowly with stirring maintaining the pH below 7 until addition is complete. The mixture is stirred for 4 days with warming to 50° C. on a water bath. The substantially clear liquid is then filtered to yield bis(nitrilotriacetato)dysprosium (III)/tri(hydroxyethyl amine) [Dy(NTA)]$_2$[HTEA]$_3$ (0.303M).

In accordance with the above-procedure but utilizing lithium hydroxide in place of tri(hydroxyethyl) amine there is obtained the corresponding lithium associated chelate.

In accordance with the above-procedure, but where in place of H$_3$NTA there is employed H$_2$DPA, phytic acid, H$_3$CA, H$_6$TTHA, H$_2$WO$_4$, H$_7$PW$_{11}$O$_{39}$, H$_4$SiW$_{11}$O$_{40}$, H$_3$PW$_9$O$_{31}$, citric acid, H$_8$EDTMP, H$_6$NTMP, and H$_4$(1-HEDP), there are obtained the corresponding Dy(DPA)$_3^{3-}$, Dy(phytate)$_2^{21-}$, Dy(phytate)$^{9-}$, Dy(CA)$_3^{6-}$, Dy(TTHA)$^{3-}$, Dy(W$_{10}$O$_{35}$)$^{7-}$, Dy(PW$_{11}$O$_{39}$)$_2^{11-}$, Dy(SiW$_{11}$O$_{39}$)$_2^{13-}$ Dy(P$_2$W$_{17}$O$_{61}$)$_2^{17-}$, Dy(citrate)$_3^{6-}$, Dy(EDTMP)$^{5-}$, Dy(EDTMP)$_2^{13-}$ Dy(NTMP)$_2^{9-}$, Dy(NTMP)$^{3-}$ and Dy(1-HEDP)$_2^{5-}$ associated with the proton acceptor employed.

In accordance with the foregoing procedures where thulium oxide is used in place of dysprosium oxide the corresponding thulium chelate is obtained.

EXAMPLE 7

Thulium chloride (1.45 g) is taken up in water (45 ml) in the presence of H$_6$TTHA (2.73 g) and sodium hydroxide (1.26 g/5 mlH$_2$O) added thereto, holding the pH below 7 during ambient temperature addition there is thus obtained [Tm (TTHA)] [Na]$_3$ (50 ml, 105 mM.)

We claim:

1. A method of shifting the nuclear magnetic resonance spectrum of alkali or alkaline earth metal ions which comprises adding to an aqueous solution of said ions a shift effective amount of a chelate of dysprosium or thulium having a charge of at least −3.

2. A method of claim 1 wherein the ions are selected from the group consisting of $^{23}$Na$^+$, $^{39}$K$^{30}$, $^{25}$Mg$^{2+}$, $^{43}$Ca$^{2+}$ and $^7$Li$^+$.

3. A method of claim 2 wherein the molar concentration of the shift reagent relative to the molar concentration of the ions whose spectrum is to be shifted is at least 0.05:1.

* * * * *